United States Patent [19]

Wanner

[11] Patent Number: 5,273,783
[45] Date of Patent: Dec. 28, 1993

[54] CHEMICAL VAPOR DEPOSITION OF TITANIUM AND TITANIUM CONTAINING FILMS USING BIS (2,4-DIMETHYLPENTADIENYL) TITANIUM AS A PRECURSOR

[75] Inventor: Brenda D. Wanner, Boise, Id.

[73] Assignee: Micron Semiconductor, Inc., Boise, Id.

[21] Appl. No.: 36,619

[22] Filed: Mar. 24, 1993

[51] Int. Cl.$^5$ .............................................. C23C 16/00
[52] U.S. Cl. ................... 427/250; 427/255.1; 427/255.2; 427/255; 427/248.1; 427/314; 427/124; 427/126.1
[58] Field of Search ............... 427/250, 255.1, 255.2, 427/255, 248.1, 314, 124, 123, 126.1

[56] References Cited

U.S. PATENT DOCUMENTS 5,130,172 7/1992 Hicks et al. .................... 427/252
5,192,589 3/1993 Sandhu ........................ 427/255.1

OTHER PUBLICATIONS

"Bis(2,4-dimethylpentadienyl) Complexes of the Transition Metals" D. R. Wilson, L. Stahl, and R. D. Earnst, Organometall. Synth. vol. 3, p.136–141 (1986).
Journal of Organometallic Chemistry vol. 250 (1983) p. 257–263 "Carbonyl and Trifluorophosphine Adducts of Bis(2,4-Dimethylpentadienyl)Titanium and Bis (2,4-Dimethylpentadienyl)Vanadium", Richard D. Earnst Ju-Zheng Liu and David R. Wilson.
Bis(2,4-dimethylpentadienyl)titanium: An "Open Titanocene", Ju-Zheng Liu and Richard D. Ernst, J. Am. Chem. Soc., vol. 104, p. 3733-3739 (1982).

*Primary Examiner*—Roy King
*Attorney, Agent, or Firm*—Angus C. Fox, III

[57] ABSTRACT

A process is disclosed for creating highly-conformal titanium-containing films via chemical vapor deposition using bis 2,4-dimethylpentadienyl) titanium, an analog thereof, or a Lewis-base-stabilized form thereof, as a precursor. The deposition process takes place in a low-pressure chamber. A substrate within the chamber, and on which the film is to be deposited, is heated to a temperature within a range of about 300–600° C. In one embodiment of the invention, titanium precursor compound vapor is admitted to the chamber either solely or in combination with one or more carrier gases. In another embodiment, titanium precursor compound vapor in combination with one or more carrier gases and/or other vapor phase reactants are admitted to the chamber.

23 Claims, 1 Drawing Sheet

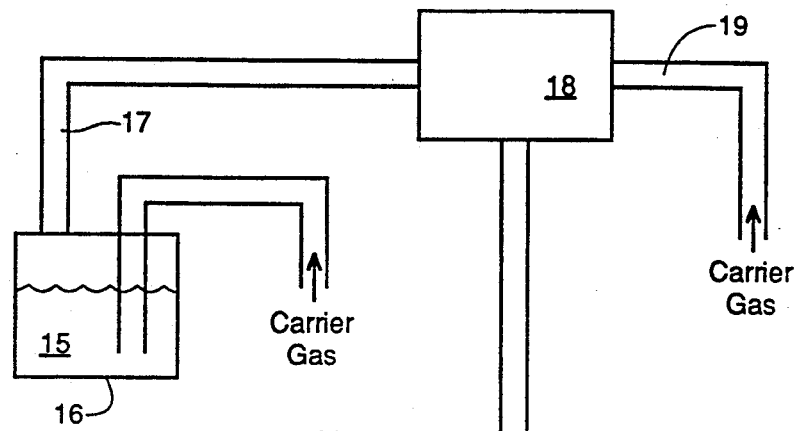
FIG. 2
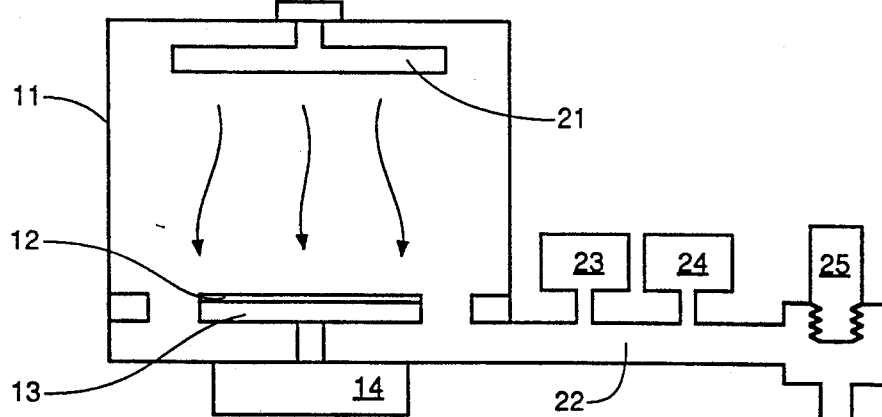
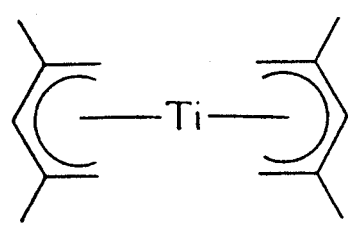
FIG. 1
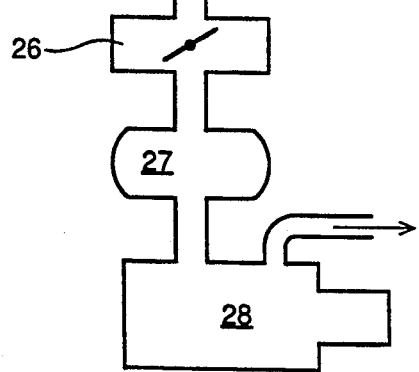

CHEMICAL VAPOR DEPOSITION OF TITANIUM AND TITANIUM CONTAINING FILMS USING BIS (2,4-DIMETHYLPENTADIENYL) TITANIUM AS A PRECURSOR

Field of the Invention

This invention relates to chemical vapor deposition (CVD) processes and, more particularly, to a process for depositing titanium metal from an organo-metallic precursor compound. The process is disclosed in the context of a low-pressure chemical vapor deposition (LPCVD) process, which is applicable to the manufacture of integrated circuits.

BACKGROUND OF THE INVENTION

Titanium figures prominently in the manufacture of contemporary integrated circuits. Titanium is frequently reacted with silicon interconnect lines to reduce their sheet resistance. Titanium nitride, a hard gold-colored compound, is commonly used as a barrier material where both conductivity and resistance to ion migration are important. Titanium carbide, a good dielectric, may also be used as a barrier material in certain applications. A metallic titanium layer is often used as a "glue" layer to promote adhesion of subsequently deposited layers to an underlying layer. Titanium-containing layers are often formed by reacting other compounds with a titanium metal layer.

Heretofore, reactive sputtering was the only method available for depositing a titanium metal layer on a substrate. For deposition of titanium metal on a planar surface, reactive sputtering works reasonably well. However, step coverage on steeply sloped and vertical surfaces is poor. Given the fact that the trend in integrated circuit manufacturing is toward smaller dimensions and greater topography, the days of reactive sputtering as a deposition technique in integrated circuit manufacture are numbered.

Creating titanium metal layers on a substrate through chemical vapor deposition would be advantageous, as very thin layers having highly uniform thickness on both horizontal and vertical surfaces would be possible. Unfortunately, there are relatively few known titanium sources and no commercially available low-valent sources which might serve as a precursor for chemical vapor deposition. It is generally acknowledged that the lower the valence of the metal atom in a metal-organic precursor compound, the easier it is to reduce the metal in the compound to the zero valence state.

SUMMARY OF THE INVENTION

This invention is a process for creating highly-conformal titanium-containing films via chemical vapor deposition using bis(2,4-dimethylpentadienyl) titanium as a precursor. Bis(2,4-dimethylpentadienyl) titanium is a divalent, 14-electron, open-sandwich compound of titanium. It's low melting point ($-10°$ C.) and high vapor pressure, in addition to the divalent nature of the incorporated titanium atoms, make it an interesting candidate for chemical vapor deposition reactions.

The deposition process, which constitutes the invention, takes place in a low-pressure chamber (i.e, a chamber in which pressure has been reduced to between 0.1 and 2 Torr). A substrate within the chamber, and on which the film is to be deposited, is heated to a temperature within a range of about 300–600° C. In one embodiment of the invention, titanium precursor compound vapor is admitted to the chamber either solely or in combination with one or more carrier gases. In another embodiment, titanium precursor compound vapor in combination with one or more carrier gases and/or other vapor phase reactants are admitted to the chamber. The LPCVD process may also be adapted to include electromagnetic radiation within the chamber, which allows a reduction in substrate temperatures. Such a process is known as photon-enhanced CVD.

BRIEF DESCRIPTION OF THE DRAWINGS

FIG. 1 is a chemical schematic drawing of the organo-metallic molecule bis(2,4-dimethylpentadienyl) titanium; and FIG. 2 is a schematic representation of a conventional, cold-wall LPCVD reactor system.

PREFERRED EMBODIMENT OF THE INVENTION

Bis(2,4-dimethylpentadienyl)titanium is a dark-green, divalent, 14-electron, open-sandwich compound. FIG. 1 provides a 2-dimensional representation of a bis(2,4-dimethylpentadienyl)titanium molecule. The titanium atom in the compound is sandwiched between a pair of 2,4-dimethylpentadienyl ligands. The low melting point ($-10°$ C.) and high vapor pressure of bis(2,4-dimethylpentadienyl)titanium, in addition to the divalent nature of the incorporated titanium atoms, make the compound an attractive candidate for chemical vapor deposition reactions. Divalent titanium is much more easily reduced to Ti (0) than is Ti (+3) and Ti (+4).

Unlike its well-known counterpart, $Ti(C_5H_5)_2$ or titanocene, bis(2,4-dimethylpentadienyl) titanium is a stable compound at room temperature, and is most easily prepared by reacting 2,4-dimethylpentadienyl with $TiCl_2$. Details of its synthesis are found in *Organometal Synthesis*, 1986, Vol. 3, pp 138–139. This material is hereby incorporated in this disclosure by reference.

The new titanium chemical vapor deposition process will be described with reference to a low-pressure chemical vapor deposition reactor system, such as the one depicted in FIG. 2. Deposition takes place in a cold wall chamber 11 which has been evacuated to a pressure of between 0.1 and 10 torr. A wafer 12, on which the deposition will be performed, is mounted on a susceptor 13, which is heated to a temperature within a range of 200–600° C. by a heat lamp array 14. For the instant process, a carrier gas selected from a group consisting of the noble gases and nitrogen and hydrogen is bubbled through liquid bis (2,4-dimethylpentadienyl) titanium 15 (the metal-organic precursor compound) in a bubbler apparatus 16 at a rate within a range of 20 to 400 standard cubic centimeters per minute (scc/m). The precursor compound 15 within the bubbler apparatus is maintained at a relatively constant temperature of between 40–100° C. The carrier gas, at least partially saturated with vaporized metal-organic precursor compound 15, is transported via a primary intake manifold 17 to a premix chamber 18. Additional carrier gases may be optionally supplied to premix chamber 18 via supply tube 19. Carrier gas, at least partially saturated with the precursor compound 15, is then ducted through a secondary intake manifold 20 to a shower head 21, from which it enters the chamber 11. The precursor compound 15, upon coming into contact with the heated wafer, decomposes and deposits as a highly conformal titanium film on the surface of the wafer 12.

The reaction products from the decomposition of the precursor compound 15 are withdrawn from the chamber 11 via an exhaust manifold 22. Incorporated in the exhaust manifold 22 are a pressure sensor 23, a pressure switch 24, a vacuum valve 25, a pressure control valve 26, a blower 27, and a particulate filter, which filters out solid reactants before the exhaust is vented to the atmosphere. During the deposition process, the pressure within chamber 11 is maintained at a pressure within a range of 0.1 to 1.0 torr by pressure control components 23, 24, 25, 26, and 27. The process parameters that are presently deemed to be optimum are a chamber pressure of about 0.5 torr, a carrier gas flow through secondary intake manifold 20 of about 40 scc/m, a wafer temperature of about 420° C., and a precursor temperature of about 50° C.

In one embodiment of the process, titanium precursor compound vapor is admitted to the chamber either solely or in combination with one or more carrier gases. Carrier gases can be one of the noble gases or $N_2$. In such a case, the principal deposition product is titanium metal having some carbon contamination in the form of titanium carbide. The reaction mechanism is assumed to be the following: $Ti[2,4-(CH_3)_2C_5H_5]_2 \rightarrow Ti + CH_n + CH$.

The titanium precursor compound can also be introduced into the chamber in vapor phase in combination with one or more carrier gases. Other vapor phase reactants may also be introduced into the chamber.

In another embodiment of the process, the titanium precursor compound is reacted with a Lewis base, such as $NH_3$, CN, or $H_2N—CH_2—CH_2—NH_2$. The resultant compounds are somewhat more stable than unreacted bis(2,4-dimethylpentadienyl)titanium. The titanium precursor compound, in combination with the reacted Lewis base, is then introduced into the chamber in vaporized form.

In yet another embodiment of the process, a reducing agent is introduced into said chamber simultaneously with the introduction of said vaporized precursor compound. When ammonia gas is used as a reducing agent, a titanium-containing film comprised principally of titanium nitride (a binary titanium compound) is deposited directly. When silicon-containing compounds, such as silane and disilane, are allowed to react with bis(2,4-dimethylpentadienyl)titanium, a titanium-containing film comprising principally titanium silicide, is deposited directly.

In still another embodiment of the process, reducing agents such as chlorine, fluorine, and hydrogen result in the deposition of a titanium metal layer having less incorporated reaction byproducts.

Although only several embodiments of the invention have been disclosed herein, it will be obvious to those having ordinary skill in the art of chemical vapor deposition techniques that changes and modifications may be made thereto without departing from the spirit and scope of the invention as claimed.

I claim:

1. A chemical vapor deposition process for depositing a titanium-containing film on a substrate comprising the steps of:
   (1) disposing the substrate within a chemical vapor deposition chamber;
   (2) introducing a vaporized organometallic precursor compound into said chamber, said precursor compound being selected from the group consisting of bis(2,4-dimethylpentadienyl)titanium, an analog of bis(2,4-dimethylpentadienyl)titanium, and bis(2,4-dimethylpentadienyl)titanium in combination with a Lewis base; and
   (3) heating the substrate to a temperature sufficient to cause said vaporized precursor compound to decompose at the surface of the substrate, thereby resulting in the deposition of the titanium-containing film on the surface of the substrate.

2. The process of claim 1, wherein said Lewis base is selected from the group consisting of $NH_3$, CN—, and $H_2N—CH_2—CH_2—NH_2$.

3. The process of claim 1, wherein said substrate is a semiconductor wafer.

4. The process of claim 1, wherein said substrate is positioned on a heated susceptor plate, and heat is transferred from said susceptor plate to said substrate.

5. The process of claim 1, wherein a reducing agent is introduced into said chamber simultaneously with the introduction of said vaporized precursor compound.

6. The process of claim 5, wherein said reducing agent is ammonia gas.

7. The process of claim 5, wherein said reducing agent is a silicon-containing compound.

8. The process of claim 5, wherein said reducing agent is chlorine.

9. The process of claim 5, wherein said reducing agent is fluorine.

10. The process of claim 5, wherein said reducing agent is hydrogen.

11. The process of claim 3, wherein said wafer is heated to a temperature within a range of 200-600° C.

12. The process of claim 11, wherein said wafer is heated to a temperature of about 420° C.

13. The process of claim 1, wherein said vaporized precursor compound is transported to the chamber via at least one carrier gas.

14. The process of claim 13, wherein said precursor compound is introduced into said carrier gas in a bubbler apparatus.

15. The process of claim 13, wherein said carrier gas is a noble gas.

16. The process of claim 13, wherein said at least one carrier gas is $N_2$.

17. The process of claim 14, wherein said precursor compound within said bubbler apparatus is maintained at a temperature in excess of its sublimation temperature.

18. The process of claim 4, wherein reaction products from the decomposition of the precursor compound are removed from the chamber as the reaction proceeds.

19. The process of claim 4, wherein the walls of said chamber are maintained at a temperature that is insufficient to decompose the precursor compound.

20. The process of claim 4, wherein the pressure within the chamber is maintained at a pressure within a range of 0.1 to 1.0 torr.

21. The process of claim 20, wherein the pressure within the chamber is maintained at a pressure of about 0.5 torr.

22. The process of claim 7, wherein said silicon-containing compound is silane.

23. The process of claim 7, wherein said silicon-containing compound is disilane.

* * * * *